(12) United States Patent
Holmes et al.

(10) Patent No.: US 11,309,479 B2
(45) Date of Patent: Apr. 19, 2022

(54) COMPUTING DEVICES CONTAINING MAGNETIC JOSEPHSON JUNCTIONS WITH EMBEDDED MAGNETIC FIELD CONTROL ELEMENT

(71) Applicant: International Business Machines Corporation, Armonk, NY (US)

(72) Inventors: Steven J. Holmes, Ossining, NY (US); Bruce B. Doris, Slingerlands, NY (US); Matthias Georg Gottwald, New Rochelle, NY (US); Rajiv Joshi, Yorktown Heights, NY (US); Sudipto Chakraborty, Plano, TX (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 16/706,367

(22) Filed: Dec. 6, 2019

(65) Prior Publication Data
US 2021/0175407 A1    Jun. 10, 2021

(51) Int. Cl.
*H01L 39/22* (2006.01)
*H01L 39/02* (2006.01)
(Continued)

(52) U.S. Cl.
CPC ........... *H01L 39/223* (2013.01); *G06N 10/00* (2019.01); *H01L 39/025* (2013.01); *H01L 39/2493* (2013.01); *H01L 43/02* (2013.01)

(58) Field of Classification Search
CPC ..... H01L 39/22; H01L 39/223; H01L 39/025; H01L 39/045; H01L 39/2493; H01L 39/12
See application file for complete search history.

(56) References Cited

U.S. PATENT DOCUMENTS 10,243,132 B1    3/2019 Rosenblatt et al.
2009/0284883 A1*  11/2009 Lee ..................... H01L 24/11
                                                    361/56
(Continued)

FOREIGN PATENT DOCUMENTS

CN    106953000 A    7/2017
CN    108364951 A    8/2018
(Continued)

OTHER PUBLICATIONS

Schneider et al., "Ultralow Power Artifical Synapses Using Nanotextured Magnetic Josephson Junctions", Science Advamces, Jan. 26, 2018, pp. 1-8 (Year: 2018).*
(Continued)

*Primary Examiner* — Vincent Wall
(74) *Attorney, Agent, or Firm* — Scully, Scott, Murphy & Presser, P.C.; Daniel P. Morris, Esq.

(57) ABSTRACT

A within-chip magnetic field control device is formed in proximity to a Josephson Junction (JJ) structure. The within-chip magnetic field control device includes wiring structures that are located laterally adjacent to the JJ structure. In some embodiments, the magnetic field control device also includes, in addition to the wiring structures, a conductive plate that is connected to the wiring structures and is located beneath the JJ structure. Use of electrical current through the wiring structures induces, either directly or indirectly, a magnetic field into the JJ structure. The strength of the field can be modulated by the amount of current passing through the wiring structures. The magnetic field can be turned off as needed by ceasing to allow current to flow through the wiring structures.

10 Claims, 11 Drawing Sheets

(51) Int. Cl.
*G06N 10/00* (2022.01)
*H01L 39/24* (2006.01)
*H01L 43/02* (2006.01)

(56) References Cited

U.S. PATENT DOCUMENTS

| | | | |
|---|---|---|---|
| 2012/0261787 A1* | 10/2012 | Stamper | H01L 27/01 257/506 |
| 2015/0200353 A1 | 7/2015 | Zhang et al. | |
| 2018/0138389 A1* | 5/2018 | Kirby | H01L 39/2406 |
| 2018/0219150 A1 | 8/2018 | Lanting et al. | |
| 2019/0164959 A1 | 5/2019 | Thomas et al. | |
| 2019/0207076 A1 | 7/2019 | Schneider et al. | |
| 2019/0296212 A1 | 9/2019 | Rosenblatt et al. | |
| 2020/0102213 A1* | 4/2020 | Haridas | H01P 11/00 |

FOREIGN PATENT DOCUMENTS

| | | | |
|---|---|---|---|
| CN | 108807656 A | 11/2018 | |
| EP | 0005364 A1 * | 11/1979 | H01L 39/223 |

OTHER PUBLICATIONS

Schneider, M. L., et al., "Ultralow power artificial synapses using nanotextured magnetic Josephson junctions", Science Advances, Jan. 26, 2018, 8 pages, 4.

Torrejon, J., et al., "Neuromorphic computing with nanoscale spintronic oscillators", Nature, Jul. 2017, pp. 428-431, vol. 547.

Russek, S. E., et al., "Stochastic Single Flux Quantum Neuromorphic Computing using Magnetically Tunable Josephson Junctions", 2016 IEEE International Conference on Rebooting Computing (ICRC), Date of Conference: Oct. 17-19, 2016, Conference Location: San Diego, CA.

Ryazanov, V. V., et al., "Magnetic Josephson junction technology for digital and memory applications", Physics Procedia, Dec. 2012, pp. 35-41, vol. 36.

Currivan-Incorvia, J. A., et al., "Logic circuit prototypes for three-terminal magnetic tunnel junctions with mobile domain walls", Nature Communications, Published Jan. 12, 2016, 7 pages.

Bandiera, S., et al., "Comparison of Synthetic Antiferromagnets and Hard Ferromagnets as Reference Layer in Magnetic Tunnel Junctions With Perpendicular Magnetic Anisotropy", IEEE Magnetics Letters, Jul. 2010, 4 pages, vol. 1.

Schneider, "Josephson Junction Based Neuromorphic Computing", Dec. 14, 2017, 20 pages, https://beyondcmos.oml.gov/documents/Session1,Talk3-Schneider.pdf.

Engel, B. N., et al., "A 4-Mb Toggle MRAM Based on a Novel Bit and Switching Method", IEEE Transactions on Magnetics, Jan. 2005, pp. 132-136, vol. 41. No. 1.

Vernik, I., V., et al., "Magnetic Josephson Junctions with Superconducting Interlayer for Cryogenic Memory", Applied Superconductivity Conference (ASC'2012), Dec. 4, 2012, 8 pages.

Kadin, A. M., et al., "Superconducting Computing in Large-Scale Hybrid Systems", Poster at 4th IEEE Rebooting Computing Summit, Washington DC, Dec. 10, 2015, 17 pages.

International Search Report dated Feb. 25, 2021, received in a corresponding foreign application, 9 pages.

* cited by examiner

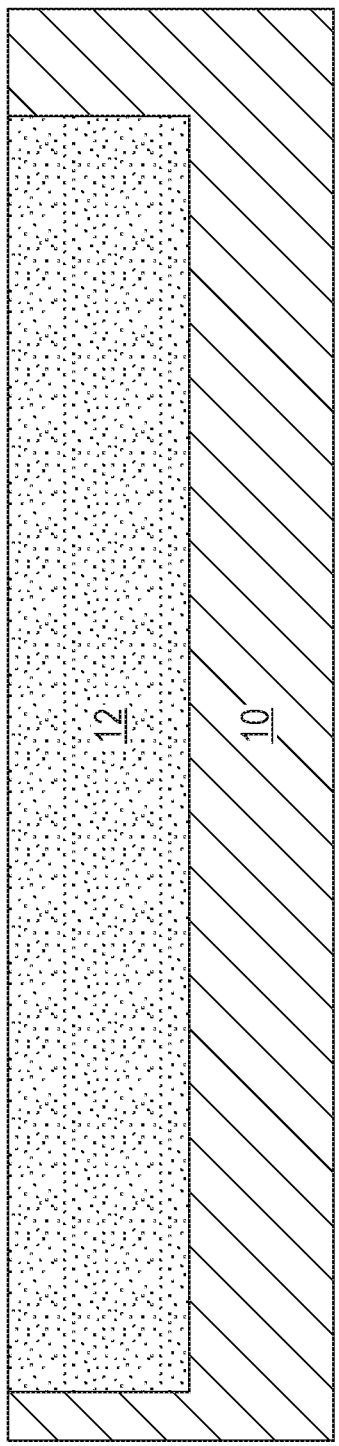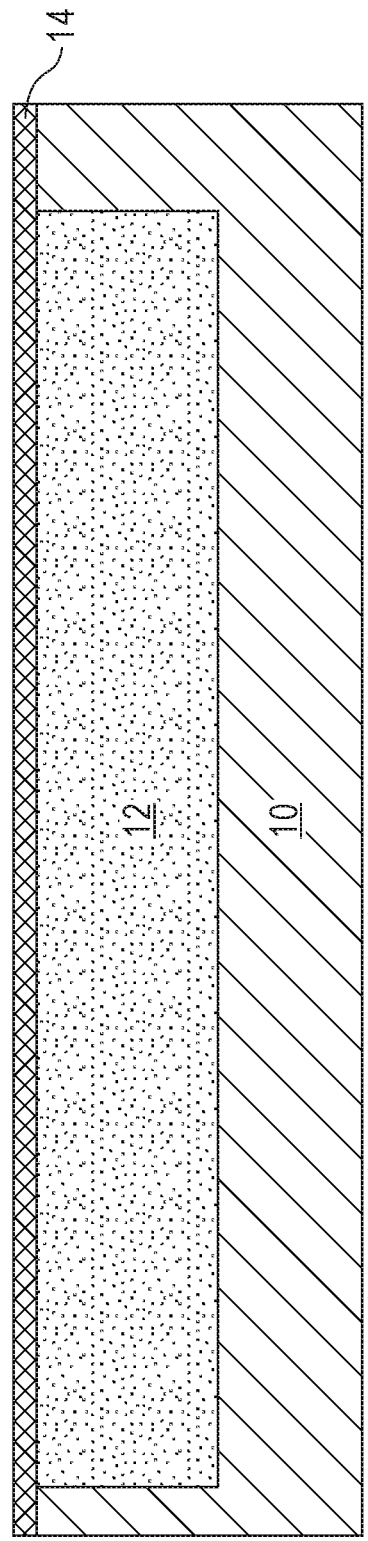

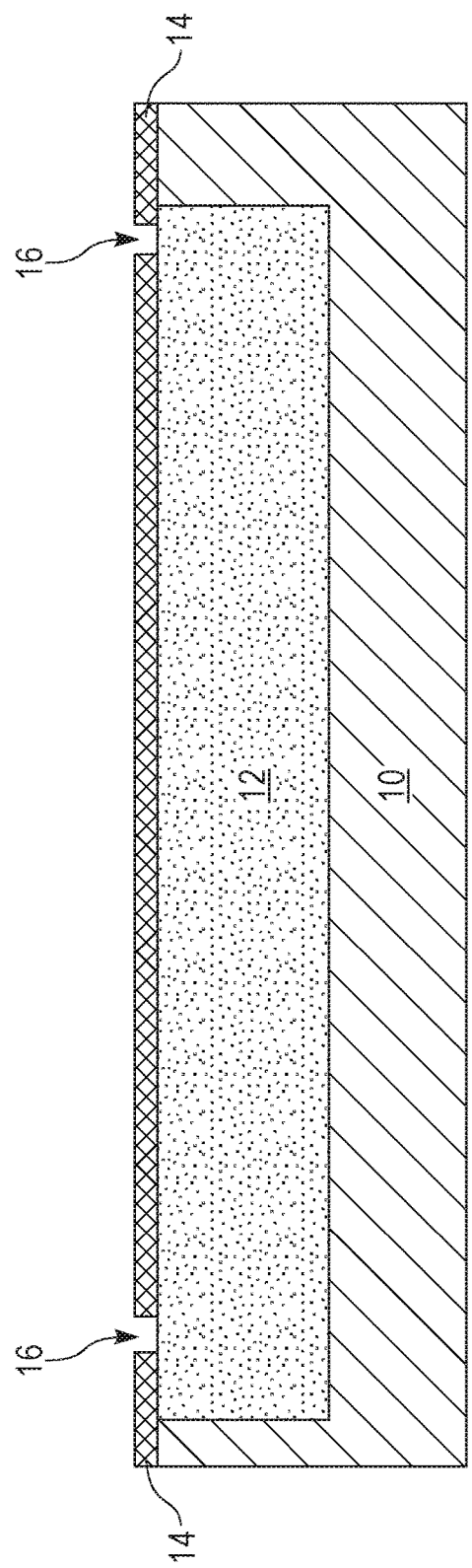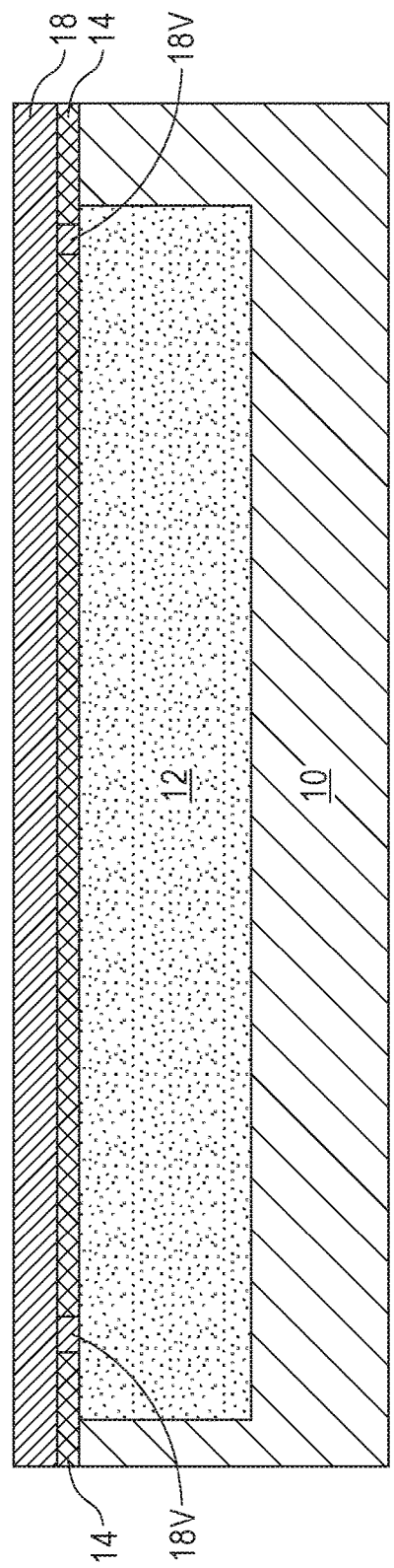

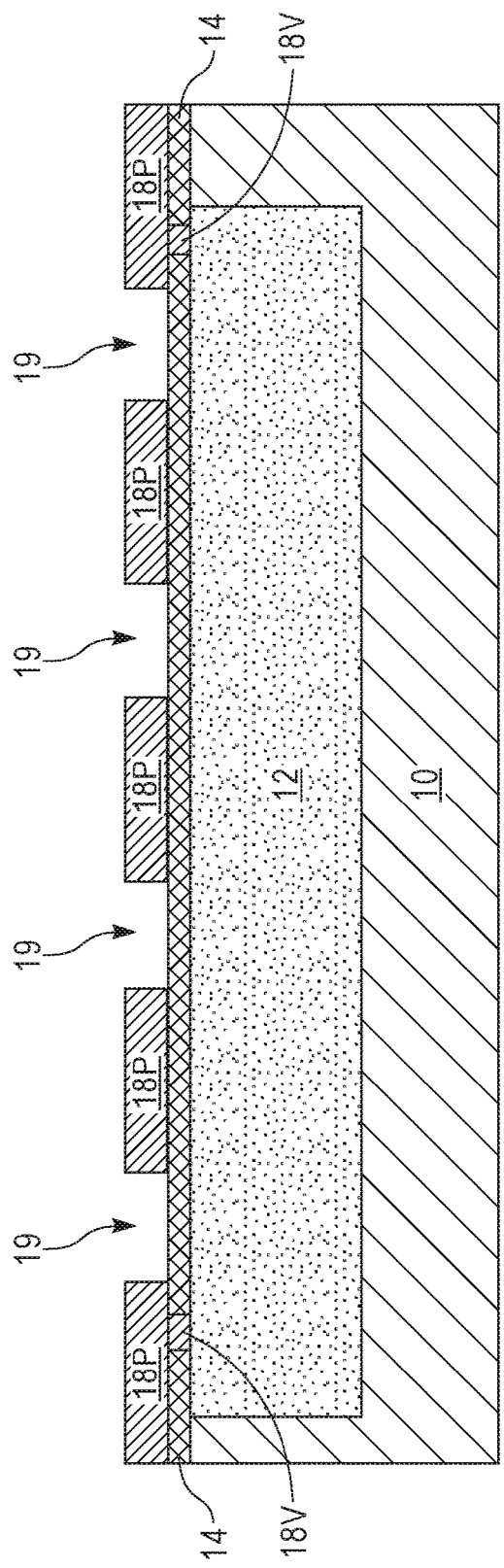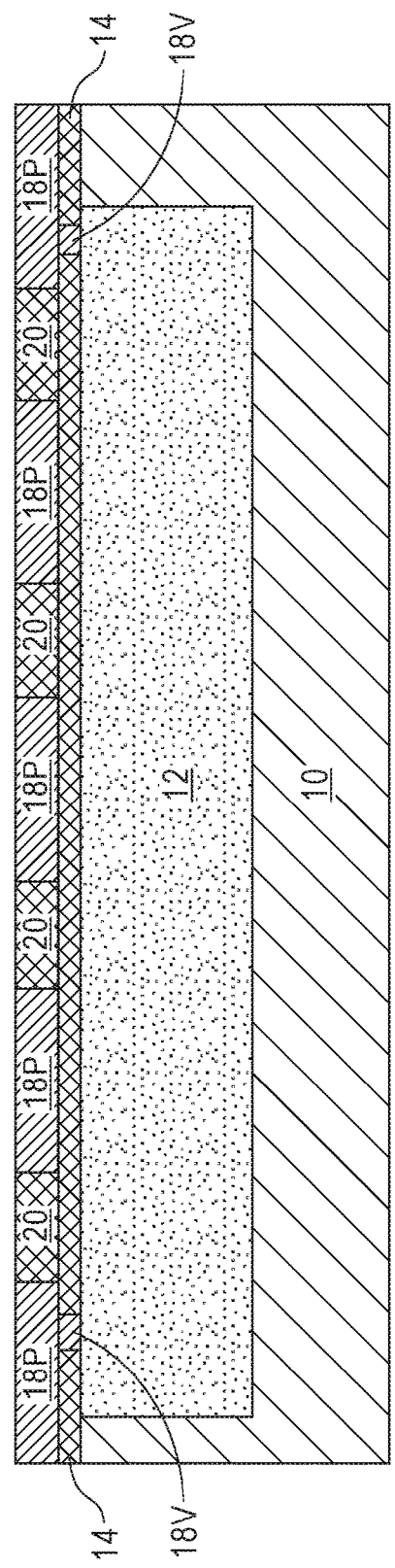

COMPUTING DEVICES CONTAINING MAGNETIC JOSEPHSON JUNCTIONS WITH EMBEDDED MAGNETIC FIELD CONTROL ELEMENT

BACKGROUND

The present application relates to a computing device (i.e., neuromorphic or Artificial Intelligence (AI)), and more particularly to a computing device that includes a within-chip magnetic field control structure that is located in proximity to a Josephson Junction (JJ) structure, and methods of forming the same.

Magnetic JJ containing devices have been identified that can be used for advanced low-power/high-performance neuromorphic applications. A JJ includes two superconductor material layers that are separated by a non-superconducting barrier layer that is so thin that electrons can cross through the barrier layer. A JJ generally manifests the Josephson Effect of a supercurrent, where current can flow indefinitely across a JJ without an applied voltage.

In devices containing magnetic JJs, an external magnetic field, perpendicular to the device, is sometimes required for their function. Toggle magnetoresistive random access memory (MRAM) has used double wires in a 90° orientation to adjust the function of an MRAM device. However, there has been no known implementation of such in devices containing magnetic JJs. Thus, there is a need to provide a within-chip magnetic field control structure that can be integrated in devices that containing JJs.

SUMMARY

A within-chip magnetic field control device is formed in proximity (within 5 nm to 500 nm) to a Josephson Junction (JJ) structure. The within-chip magnetic field control device includes wiring structures that are located laterally adjacent to the JJ structure. In some embodiments, the magnetic field control device also includes, in addition to the wiring structures, a conductive plate that is connected to the wiring structures and is located beneath the JJ structure. Use of electrical current through the wiring structures induces, either directly or indirectly, a magnetic field into the JJ structure. The strength of the field can be modulated by the amount of current passing through the wiring structures. The magnetic field can be turned off as needed by ceasing to allow current to flow through the wiring structures.

In one aspect of the present application, a computing device is provided that includes a within-chip magnetic field control structure that is located in proximity to a JJ structure. In one embodiment of the present application, the computing device includes a conductive plate embedded in a surface of a semiconductor substrate. At least one JJ structure is located above the conductive plate. First wiring structures are located laterally adjacent to the at least one JJ structure. In the present application, one of the conductive plate or the first wiring structures is configured to induce a magnetic field to the at least one JJ structure upon applying an electrical current thereto.

In another embodiment of the present application, a method of forming such a computing device is provided. In one embodiment of the present application, the method includes forming a conductive plate in a semiconductor substrate. Next, a first dielectric material layer is formed on physically exposed surfaces of the semiconductor substrate and the conductive plate, wherein the first dielectric material layer contains via openings that physically expose a surface of the conductive plate. A metal-containing layer is then formed in each of the via openings and on a topmost surface of the first dielectric material layer. Next, the metal-containing layer is patterned to provide first and second metal-containing wiring structures, wherein the first metal-containing wiring structures contact the conductive plate, and the second metal-containing wiring structures are spaced apart from the conductive plate. A JJ structure is then formed on each second metal-containing wiring structure. Next, a second dielectric material layer is formed laterally adjacent to, and above, each JJ structure. The second dielectric material layer includes wiring contact structures and JJ contact structures embedded therein. The wiring contact structures contact the first metal-containing wiring structures, and the JJ contact structures contact the JJ structures.

In another embodiment, the method includes forming a conductive plate in a semiconductor substrate. Next, at least one JJ structure is formed on the conductive plate. A first dielectric material layer is then formed laterally adjacent to the at least one JJ structure, wherein the first dielectric material layer includes wiring structures embedded therein that contact the semiconductor substrate. Next, a second dielectric material layer is formed above the first dielectric material layer and above the at least one JJ structure. The second dielectric material layer includes wiring contact structures and JJ contact structures embedded therein. The wiring contact structures contact the wiring structures, and the JJ contact structures contact the JJ structures.

BRIEF DESCRIPTION OF THE DRAWINGS

FIG. 1 is a cross sectional view of an exemplary structure that can be employed in accordance with an embodiment of the present application, the exemplary structure includes a conductive plate embedded in a semiconductor substrate.

FIG. 2 is a cross sectional view of the exemplary structure of FIG. 1 after forming a first dielectric material layer on physically exposed surfaces of the semiconductor substrate and the conductive plate.

FIG. 3 is a cross sectional view of the exemplary structure of FIG. 2 after forming via openings through the first dielectric material layer, wherein each via opening physically exposes a surface of the conductive plate.

FIG. 4 is a cross sectional view of the exemplary structure of FIG. 3 after forming a metal-containing layer in each of the via openings and on a topmost surface of the first dielectric material layer.

FIG. 5 is a cross sectional view of the exemplary structure of FIG. 4 after patterning the metal-containing layer to provide metal-containing wiring structures on the first dielectric material layer.

FIG. 6 is a cross sectional view of the exemplary structure of FIG. 5 after forming a gap filling dielectric material into a gap that is located between each metal-containing wiring structure.

DETAILED DESCRIPTION

Figure 7:
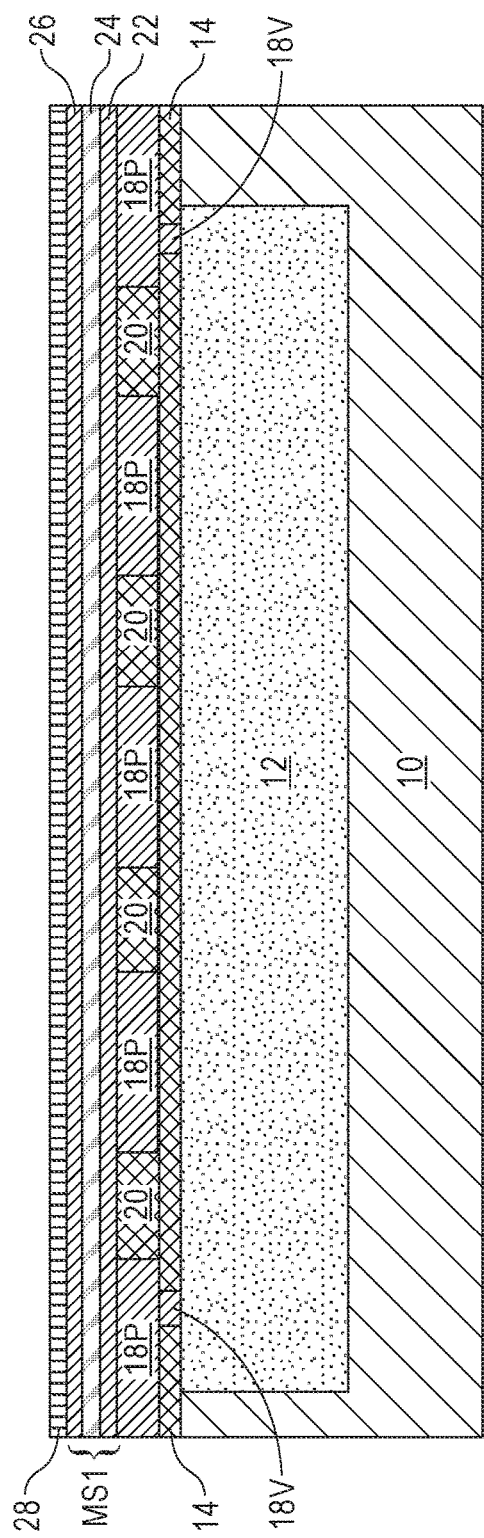
FIG. 7 is a cross sectional view of the exemplary structure of FIG. 6 after forming a precursor JJ material stack thereon.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference will be first made to FIGS. 1-13 which illustrate a first method of the present application that can be used in providing a computing device containing a within-chip magnetic control device that is located in proximity to a JJ structure. In this embodiment of the present application, a conductive plate is embedded in semiconductor substrate. Wiring structures are then formed above the conductive plate. In this embodiment, some of the wiring structures directly contact the conductive plate, while other wiring structures do not contact the conductive plate. A JJ structure is then formed above each wiring structure that does not contact the conductive plate. Next, contact structures are formed. Some of the contact structures contact the wiring structures that directly contact the conductive plate, while other contact structures contact the JJ structures. Collectively, and in this embodiment, the conductive plate and the wiring structures that are connected to the conductive plate serve as a magnetic control device that is located in proximity to each JJ structure.

In this embodiment, the conductive plate can generate a magnetic field by running current through the wiring structures; a magnetic field can also be generated by the wiring structures themselves but such a magnetic field is negligible in comparison to the magnetic field generated by the conductive plate. The strength of the magnetic field can be modulated by the amount of current passing through the wiring structures. Also, the magnetic field can be turned off as needed by ceasing to allow current to pass through the wiring structures.

Referring first to FIG. 1, there is illustrated an exemplary structure that can be employed in accordance with an embodiment of the present application. The exemplary structure of FIG. 1 includes a conductive plate 12 embedded in a semiconductor substrate 10. Notably, the conductive plate 12 is located in a trench that is formed in the semiconductor substrate 10 such that the semiconductor substrate 10 is located laterally adjacent to, and beneath, the conductive plate 12.

The semiconductor substrate 10 that can be employed in the present application includes at least one semiconductor material having semiconducting properties. Examples of semiconductor materials that can provide the semiconductor substrate 10 include, for example, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor substrate 10 can be a single crystalline semiconductor material. The semiconductor substrate 10 can have any of the well known crystal orientations. For example, the crystal orientation of the semiconductor substrate 10 may be {100}, {110}, or {111}. Other crystallographic orientations besides those specifically mentioned can also be used in the present application.

In some embodiments, the semiconductor substrate 10 is a bulk semiconductor substrate; i.e., a substrate that is composed entirely of at least one semiconductor material. In other embodiments, the semiconductor substrate 10 is a semiconductor-on-insulator (SOI) that includes a handle substrate, a buried insulator layer, and a top semiconductor material layer. In such an embodiment, the conductive plate 12 can be formed only within the top semiconductor material layer, or within the top semiconductor material layer and the buried insulator layer, or within the top semiconductor material layer, the buried insulator layer, and the handle substrate.

As mentioned above, the conductive plate 12 is present in a trench that is formed into the semiconductor substrate 10. The trench can be formed by a patterning process. In one embodiment, the patterning process includes lithography and etching. Lithography includes forming a photoresist material on a material or material stack that needs to be patterned (e.g., the semiconductor substrate 10), exposing the photoresist material to a desired pattern of irradiation and developing the exposed photoresist utilizing a conventional resist developer. The etch used to transfer the pattern from the developed photoresist material into the semiconductor substrate 10 can include an isotropic etch or an anisotropic etch. In one embodiment, the patterning process employs a reactive ion etch (RIE). The developed resist is typically removed from the structure after the pattern transfer etch utilizing a conventional resist stripping process such as, for example, ashing.

The trench can have numerous shapes. In one example, the trench can be cylindrical in shape. In some embodiments, the trench can have a depth, as measured from the topmost surface of the semiconductor substrate 10 to the trench bottom wall, of from 100 nm to 500 nm; although other trench depths are possible and can be used in the present application.

Although the present application describes and illustrates a single trench, a plurality of spaced apart trenches can be formed into the semiconductor substrate 10 and thereafter a conductive plate 12 can be formed into each of the trenches of the plurality of trenches.

Conductive plate 12 is then formed into each trench. The conductive plate 12 can be formed by a deposition process such as, for example, chemical vapor deposition (CVD), plasma enhanced chemical vapor deposition (PECVD), atomic later deposition (ALD), physical vapor deposition (PVD) sputtering, or plating. A planarization process such as, for example, chemical mechanical polishing (CMP) can follow the deposition of a conductive plate material.

In some embodiments, the conductive plate 12 can be composed of an electrically conductive metal-containing material. Examples of electrically conductive metal-containing materials that can be used as the conductive plate 12 include, but are not limited to, copper (Cu), aluminum (Al), tungsten (W), titanium (Ti), tantalum (Ta), titanium nitride (TiN), or a copper-aluminum alloy. In some embodiments, the conductive plate 12 can be composed of a superconductor. A superconductor is an element or metallic alloy which, when cooled below a certain threshold temperature, the material dramatically loses all electrical resistance. A superconductor can allow electrical current to flow without any significant energy loss. Examples of superconductors that can be used as the conductive plate 12 include, but are not limited to, molybdenum (Mo), niobium (Nb), osmium (Os), rhenium (Re), rhodium (Rh), ruthenium (Ru), a Nb—Ti alloy, or zirconium nitride (ZrN).

Conductive plate 12 has a same shape as the trench. In one example, the conductive plate 12 is cylindrical in shape. In some embodiments, the conductive plate 12 can have a topmost surface that is coplanar with the topmost surface of the semiconductor substrate 10. In other embodiments, the conductive plate 12 has a topmost surface that is either above or below the topmost surface of the semiconductor substrate 10.

Referring now to FIG. 2, there is illustrated the exemplary structure of FIG. 1 after forming a first dielectric material layer 14 on physically exposed surfaces of the semiconductor substrate 10 and the conductive plate 12. The first dielectric material layer 14 is a continuous layer that covers the entirety of the exemplary structure shown in FIG. 1. The first dielectric material layer 14 can be composed of any dielectric material such as, for example, silicon dioxide, silicon nitride or silicon oxynitride. In some embodiments, the first dielectric material layer 14 is composed entirely of a single dielectric material. In other embodiments, the first dielectric material layer 14 is composed of a stack of two or more dielectric materials. The first dielectric material layer 14 can be formed utilizing a deposition process such as, for example, CVD or PECVD. The first dielectric material layer 14 can have a thickness from 10 nm to 100 nm; although other thicknesses are possible and can be used as the thickness of the first dielectric material layer 14.

Referring now to FIG. 3, there is illustrated the exemplary structure of FIG. 2 after forming via openings 16 through the first dielectric material layer 14, wherein each via opening 16 physically exposes a surface of the conductive plate 12. In the illustrated embodiment, a pair of via openings 16 is shown by way of one example. Each via opening 16 can be formed by lithography and etching, as defined above. The resist used to pattern the first dielectric material layer 14 is stripped from the exemplary structure after performing the pattern transfer etch.

Referring now to FIG. 4, there is illustrated the exemplary structure of FIG. 3 after forming a metal-containing layer 18 in each of the via openings 16 and on a topmost surface of the first dielectric material layer 14. Metal-containing layer 18 can be composed of one of the electrically conductive metal-containing materials or one of the superconductors mentioned above for the conductive plate 12. In one embodiment, the metal-containing layer 18 is composed of a compositionally same material as the conductive plate 12. For example, the metal-containing layer 18 and the conductive plate 12 can both be composed of Cu. In another embodiment, the metal-containing layer 16 is composed of a compositionally different material than the conductive plate 12. For example, metal-containing layer 18 can be composed of Nb, and the conductive plate 12 can be composed of Cu.

Metal-containing layer 18 can be formed by a deposition process including, for example, CVD, PECVD, sputtering or plating. Metal-containing layer 18 has a thickness that is sufficient enough to fill each via opening 16 and extend above a topmost surface of the first dielectric material layer 14.

Referring now to FIG. 5, there is illustrated the exemplary structure of FIG. 4 after patterning the metal-containing layer 18 to provide metal-containing wiring structures 18P on the first dielectric material layer 14. As is shown, some of the metal-containing wiring structures 18P contain a lower via portion 18V that directly contacts a surface of the underlying conductive plate 12, while other metal-containing structures 18P do not contain the lower via portion 18V. The metal-containing wiring structures 18P that contain a lower via portion 18V can be referred to as a first wiring structure or a combined line-via wiring structure, while the metal-containing wiring structures 18P that do not contain the lower via portion 18V can be referred to as a second wiring structure or a line wiring structure.

The patterning of the metal-containing layer 18 includes lithography and etching, as defined above. As is shown in FIG. 5, a gap 19 exists between each of the metal-containing wiring structures 18P. As is also shown in FIG. 5, each of the first wiring structures (18P/18V) are located laterally adjacent to an area that contains the second wiring structures 18P.

Referring now to FIG. 6, there is illustrated the exemplary structure of FIG. 5 after forming a gap filling dielectric material 20 into the gap 19 located between each metal-containing wiring structure 18P. The gap filling dielectric material 20 can include any dielectric material including one of the dielectric materials mentioned above for the first dielectric material layer 14. In one embodiment, the gap filling dielectric material 20 is composed of a dielectric material that is compositionally the same as the dielectric material that provides the first dielectric material layer 14. In another embodiment, the gap filling dielectric material 20 is composed of a dielectric material that is compositionally different from the dielectric material that provides the first dielectric material layer 14.

The gap filling dielectric material 20 can be formed by depositing a dielectric material in each gap 19 and optionally atop each metal-containing wiring structure 18P. The dielectric material that provides the gap filling dielectric material 20 can be deposited by CVD, PECVD, or PVD. In some embodiments, a planarization process such as, for example, CMP can follow the deposition of the dielectric material that provides the gap filling dielectric material 20.

The gap filling dielectric material 20 entirely fills in each gap 19, and the gap filling dielectric material 20 typically has a topmost surface that is coplanar with a topmost surface of each metal-containing wiring structure 18P.

Referring now to FIG. 7, there is illustrated the exemplary structure of FIG. 6 after forming a precursor JJ material stack, MS1, thereon. In some embodiments, and as is illustrated in FIG. 7, a metal-containing capping layer 28 can be formed on a topmost surface of the precursor JJ material stack, MS1. The precursor JJ material stack, MS1, is not an active JJ structure at this point of the present application. The precursor JJ material stack, MS1, includes, from bottom to top, a first superconductor material layer 22, an amorphous silicon manganese containing (aSi—Mn) layer 24, and a second superconductor material layer 26. Although the present application specifically describes and illustrates aSi—Mn as layer 24, the present application contemplates embodiments when layer 24 is aX-M layer, wherein X is a semiconductor material such as, Si, Ge or SiGe, and M is a magnetic material such as, for example, Co, Ni, Fe, Mn or any combination thereof.

The first superconductor material layer 22 may include one of the superconductor materials mentioned above for conductive plate 12. The first superconductor material layer 22 can be composed of a superconductor material that is compositionally the same as, or compositionally different, from the superconductor material that can be used as the conductive plate 12 and/or metal-containing wiring structures 18P. The first superconductor material layer 22 can be formed by a deposition process including, for example, CVD, PECVD, sputtering, plating or ALD. The first superconductor material layer 22 can have a thickness from 5 nm to 50 nm, although other thicknesses for the first superconductor material layer 22 are contemplated and can be used as the first superconductor material layer 22.

The aSi—Mn layer 24 is composed of amorphous silicon in which manganese (Mn) has been incorporated therein. The Mn content within the aSi—Mn layer 24 can be from 15 atomic percent to 60 atomic percent. The aSi—Mn layer 24 can be formed by first depositing a layer of amorphous silicon, and then Mn can be introduced into the amorphous silicon layer, utilizing techniques such as plasma doping, or out-diffusion into the amorphous silicon layer. Alternatively, the aSi—Mn layer 24 can be formed utilizing an in-situ deposition process. The aSi—Mn layer 24 is a thin layer having a thickness from 1 nm to 50 nm. This thickness allows for electrons to be transferred from the first and second superconductor materials. If there is enough Mn in the aSi—Mn layer 24 to create a normal conductor, then the thickness of the aSi—Mn layer 24 can be greater than the range mentioned above.

The second superconductor material layer 26 may include one of the superconductor materials mentioned above for conductive plate 12. The second superconductor material layer 26 can be composed of a superconductor material that is compositionally the same as, or compositionally different, from the superconductor material that can be used as the first superconductor material layer 22 and/or as the conductive plate 12 and/or as the metal-containing wiring structures 18P. The second superconductor material layer 26 can be formed by a deposition process including, for example, CVD, PECVD, sputtering, plating or ALD. The second superconductor material layer 26 can have a thickness from 5 nm to 50 nm, although other thicknesses for the second superconductor material layer 26 are contemplated and can be used as the second superconductor material layer 26.

The metal-containing capping layer 28 can be optionally formed on the precursor JJ material stack, MS1. The metal-containing capping layer 28 can be composed of Ti, Ta, TiN, TaN, W, WN or any other high melting point metals or conductive metal nitrides. The metal-containing capping layer 28 can be composed of a single material, or it can be composed of a multilayered material stack. The metal-containing capping layer 28 can be formed by a deposition process including, for example, CVD, PECVD, sputtering, plating or ALD. The metal-containing capping layer 28 can have a thickness from 5 nm to 50 nm, although other thicknesses for the metal-containing capping layer 28 are contemplated and can be used as the metal-containing capping layer 28.

Figure 8:
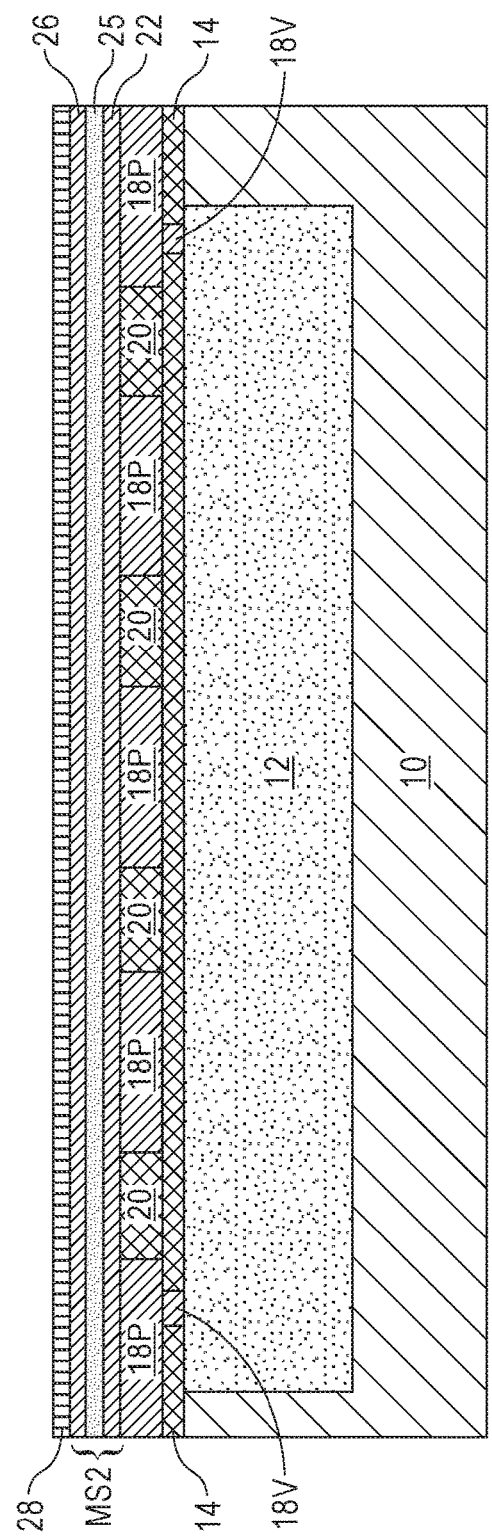
FIG. 8 is a cross sectional view of the exemplary structure of FIG. 7 after converting the precursor JJ material stack to a JJ material stack.

Referring now to FIG. 8, there is illustrated the exemplary structure of FIG. 7 after converting the precursor JJ material stack, MS1, to a JJ material stack, MS2. The JJ material stack, MS2, is active after the converting step. The converting step converts the aSi—Mn layer 24 into a Mn nanoparticle-containing crystalline silicon layer 25 (i.e., a layer of crystalline silicon containing Mn nanoparticles dispersed therein; in general the converting step converts an aX-M material, wherein X is a semiconductor material such as, Si, Ge or SiGe, and M is a magnetic material such as, for example, Co, Ni, Fe, Mn or any combination thereof, into a M nanoparticle-containing crystalline X layer, wherein M and X are as defined above. The converting does not change the first and second superconductor material layers 22, 26. The converting includes an annealing process having a low oxygen content (i.e., 10E-7 to 10E-19). The annealing process can be performed at a temperature from 300° C. to 500° C. The pressure during the annealing process can be from 2 Torr to 150 Torr. The annealing process is typically preformed in hydrogen, $H_2$. In some embodiments, an inert ambient such as, for example, helium (He), argon (Ar), or nitrogen ($N_2$) can be used. In yet other embodiments, a vacuum anneal can be used. The annealing process can include a furnace anneal, a laser anneal or a microwave anneal. The duration of the anneal varies depending on the type of annealing process employed. Generally, furnace annealing is performed for a longer duration of time than laser or microwave anneal.

In some embodiments, and if not previously formed, the metal-containing capping layer 28, as defined above, can be formed upon the JJ material stack, MS2. Alternatively, the metal-containing capping layer 28 formation can be entirely omitted from the process flow.

Figure 9:
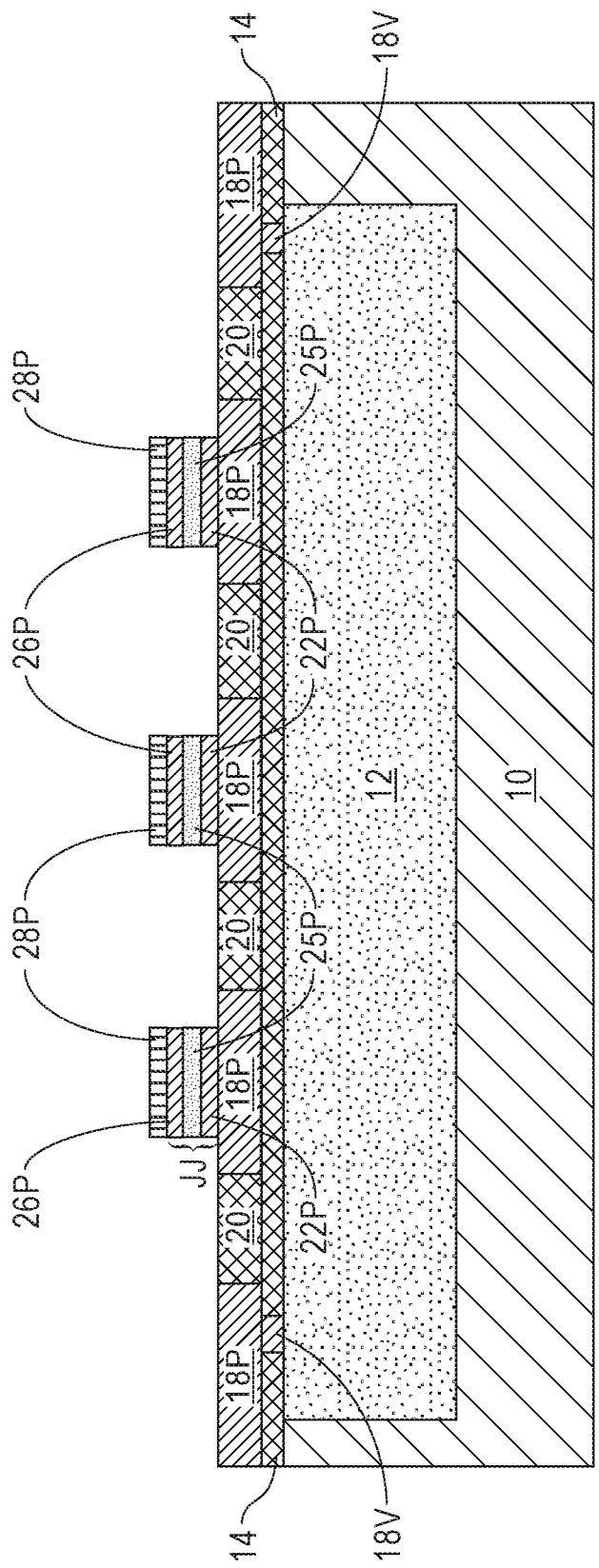
FIG. 9 is a cross sectional view of the exemplary structure of FIG. 8 after patterning the JJ material stack to form a plurality of JJ structures, each JJ structure of the plurality of JJ structures is located on a surface of a metal-containing wiring structure that is not directly contacting the conductive plate.

Referring now to FIG. 9, there is illustrated the exemplary structure of FIG. 8 after patterning the JJ material stack, MS2, to form a plurality of JJ structures, labeled as JJ in the drawings, each JJ structure of the plurality of JJ structures is located on a surface of a metal-containing wiring structure 18P (e.g., the second wiring structure) that is not directly contacting the conductive plate 12. During the patterning of the JJ material stack, MS2, and if present, the metal-containing capping layer 28 is also patterned. Although a plurality of JJ structures are described and illustrated, the present application works when a single JJ structure is formed upon a single second metal-containing wiring structure 18P.

The patterning includes lithography and etching. The etch is typically an anisotropic etch such as, for example, RIE, ion beam etching or plasma etching. Each JJ structure includes a remaining (i.e., non-etched) portion of the first superconductor material layer 22 (hereinafter referred to as a first superconductor material portion 22P), a remaining (i.e., non-etched) portion of the Mn nanoparticle-containing crystalline silicon layer 25 (hereinafter referred to as a Mn nanoparticle-containing crystalline silicon portion 25P) and a remaining (non-etched) portion of the second superconductor material layer 26 (hereinafter referred to as a second superconductor material portion 26P). When the metal-containing capping layer 28 is present, a remaining (non-etched) portion of the metal-containing capping layer 28 (hereinafter referred to as a metal-containing cap 28P) is present atop each JJ structure.

Each JJ structure and, if present, metal-containing cap 28P can be cylindrical in shape (although other shapes are possible) and has a critical dimension (CD) that is typically, but not necessarily always, less than the underlying CD of the surface of a metal-containing wiring structure 18P that is not directly contacting the conductive plate 12. As is shown, the various elements (22P, 25P, 26P) of the JJ structure have an outermost sidewall that is vertically aligned with each other. If present, the metal-containing cap 28P has an outermost sidewall that is vertically aligned with the outermost sidewall of the underlying JJ structure. As is shown, the first wiring structures (18P/18V) are laterally adjacent to the area containing the JJ structures.

Figure 10:
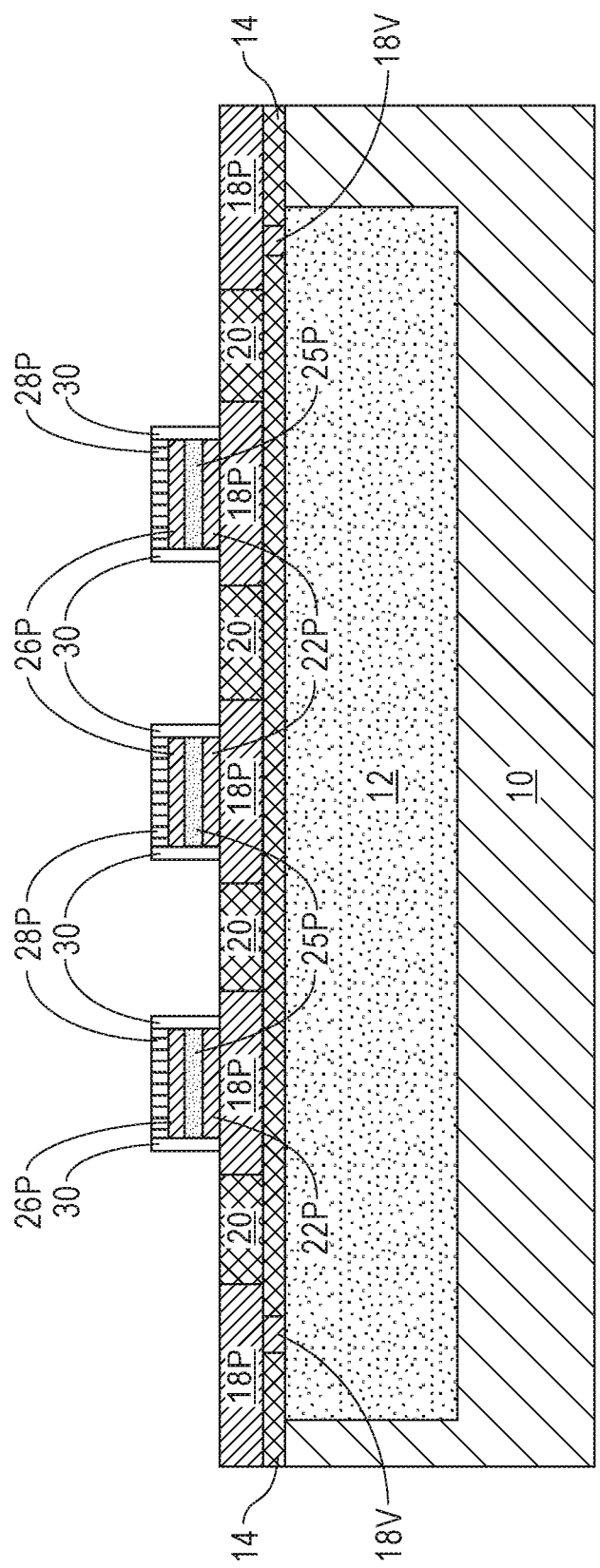
FIG. 10 is a cross sectional view of the exemplary structure of FIG. 9 after forming a dielectric spacer encapsulating each JJ structure.

Referring now to FIG. 10, there is illustrated the exemplary structure of FIG. 9 after forming a dielectric spacer 30 encapsulating each JJ structure. The dielectric spacer 30 is composed of a dielectric material that is compositionally different from the gap filling dielectric material 20. The dielectric material that provides the dielectric spacer 30 can, in some embodiments, provide passivation to the JJ structure.

In one embodiment, the dielectric spacer 30 is composed of silicon nitride. In another embodiment, the dielectric spacer 30 can be composed of a dielectric material that contains atoms of silicon, carbon and hydrogen. In some embodiments, and in addition to atoms of carbon and hydrogen, the dielectric material that provides the dielectric spacer 30 can include atoms of at least one of nitrogen and oxygen. In other embodiments, and in addition to atoms of silicon, nitrogen, carbon and hydrogen, the dielectric material that provides the dielectric spacer 30 can include atoms of boron. In one example, the dielectric spacer 30 can be composed of an nBLOK dielectric material that contains atoms of silicon, carbon, hydrogen, nitrogen and oxygen. In alternative example, the dielectric spacer 30 can be composed of a SiBCN dielectric material that contains atoms of silicon, boron, carbon, hydrogen, and nitrogen.

The dielectric spacer 30 can be formed by first depositing a continuous layer of the dielectric material that provides the dielectric spacer 30. A spacer etch, such as, for example, RIE, follows the deposition of the dielectric material that provides the dielectric spacer 30. The dielectric spacer 30 can have a thickness from 10 nm to 200 nm. Other thicknesses are possible and can be employed as the thickness of the dielectric spacer. The dielectric spacer 30 typically has a topmost surface that is coplanar with a topmost surface of the metal-containing cap 28P or, when the metal-containing cap 28P is not present, with a topmost surface of the JJ structure. Although the dielectric spacer 30 is illustrated as having an I shape, the dielectric spacer 20 can be L shaped and extend upon exposed surfaces of the metal-containing wiring structure 18P and/or the dielectric gap filling material 20.

Figure 11:
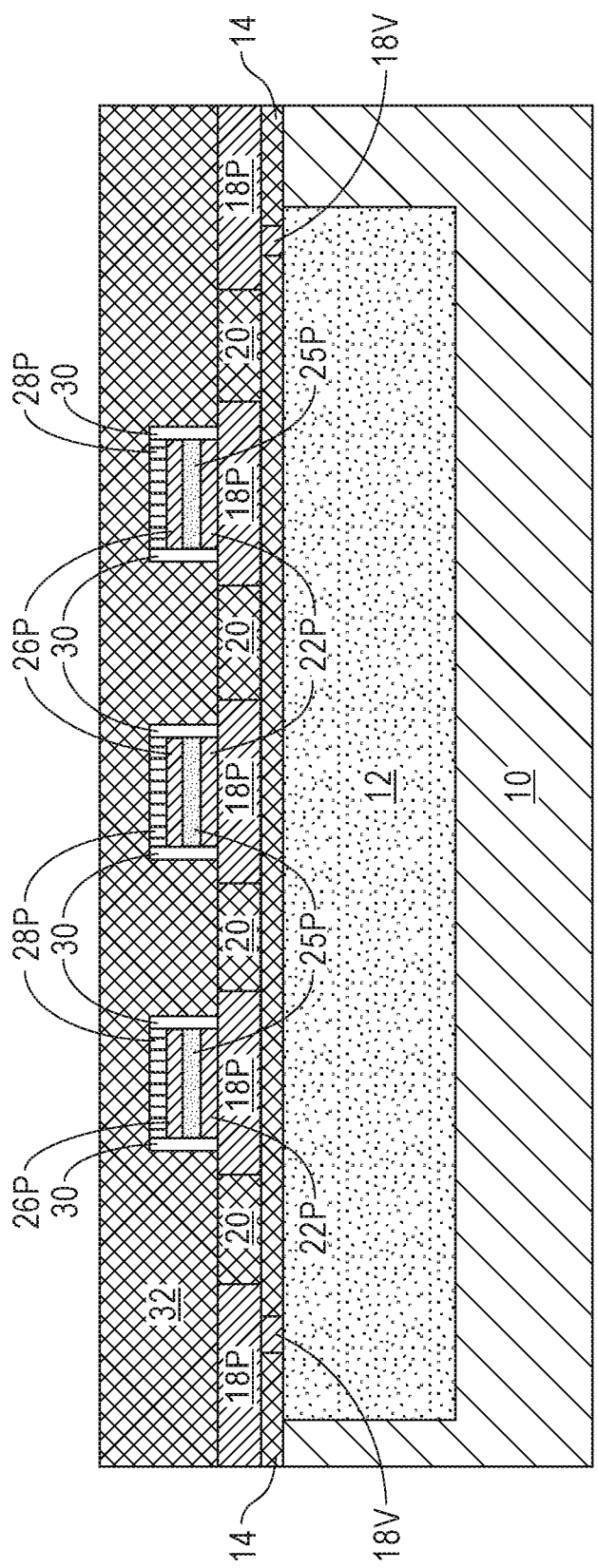
FIG. 11 is a cross sectional view of the exemplary structure of FIG. 10 after forming a second dielectric material layer laterally adjacent to, and above, each dielectric spacer encapsulated JJ structure.

Referring now to FIG. 11, there is illustrated the exemplary structure of FIG. 10 after forming a second dielectric material layer 32 laterally adjacent to, and above, each dielectric spacer 30 encapsulated JJ structure. The second dielectric material layer 32 can be composed of one of the dielectric materials mentioned above for the first dielectric material layer 14; the dielectric material that provides the second dielectric material layer 32 is typically compositionally different from the dielectric material that provides the dielectric spacer 30. The second dielectric material layer 32 can also be composed of an interlayer dielectric material such as, for example, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0; all dielectric constants are measured under vacuum unless otherwise stated herein). In another embodiment, a self-planarizing material such as a spin-on glass (SOG) or a spin-on low-k dielectric material can be used as the dielectric material for the second dielectric material layer 32. The second dielectric material layer 32 can be formed utilizing a deposition process such as, for example, CVD, PECVD, or spin-on coating.

Figure 12:
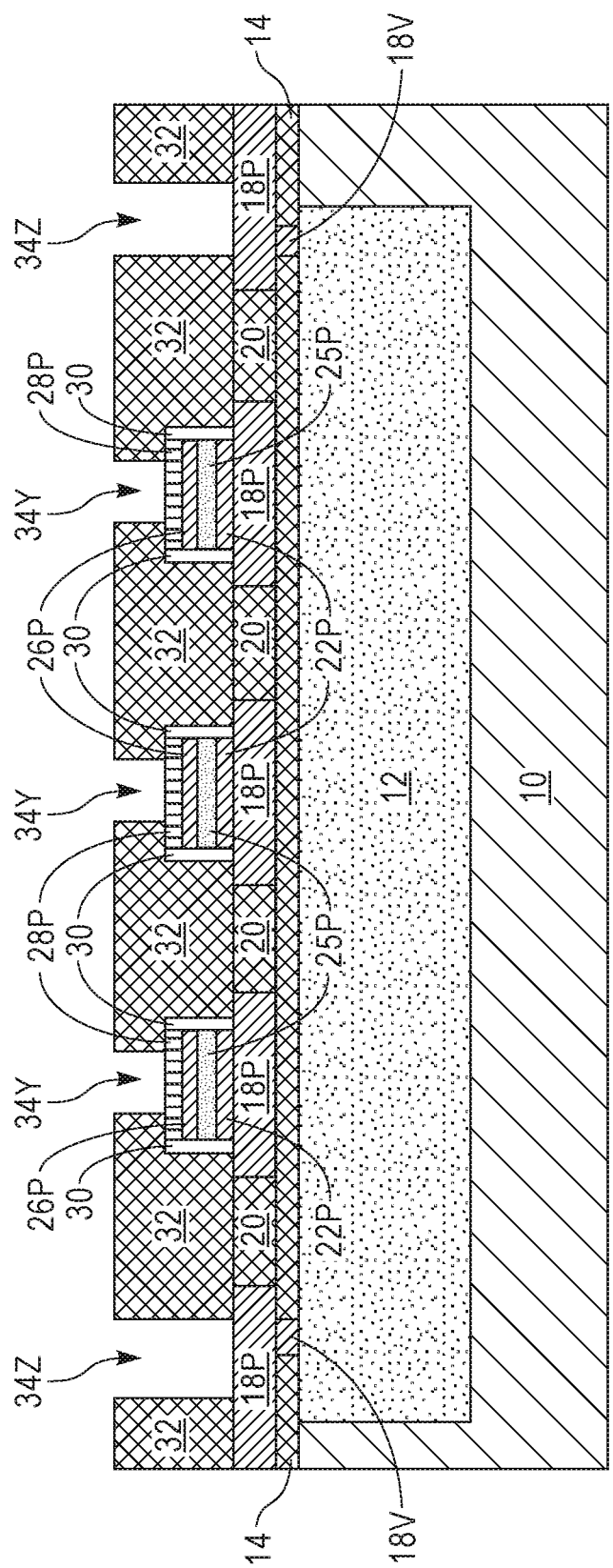
FIG. 12 is a cross sectional view of the exemplary structure of FIG. 11 after forming a plurality of contact openings in the second dielectric material layer.

Referring now to FIG. 12, there is illustrated the exemplary structure of FIG. 11 after forming a plurality of contact openings (34Z, 34Y) in the second dielectric material layer 32. The plurality of contact openings can be formed by lithography and etching. Each contact opening 34Z physically exposes a surface of one of the metal-containing wiring structures 18P that contain the lower via portion 18V, while each contact opening 34Y physically exposes either a topmost surface of one of the metal-containing caps 28P, or the topmost surface of one of the second superconductor material portions 26P. Contact openings 34Z can be referred to as wiring contact openings, while contact openings 34Y can be referred to as JJ structure contact openings.

Figure 13:
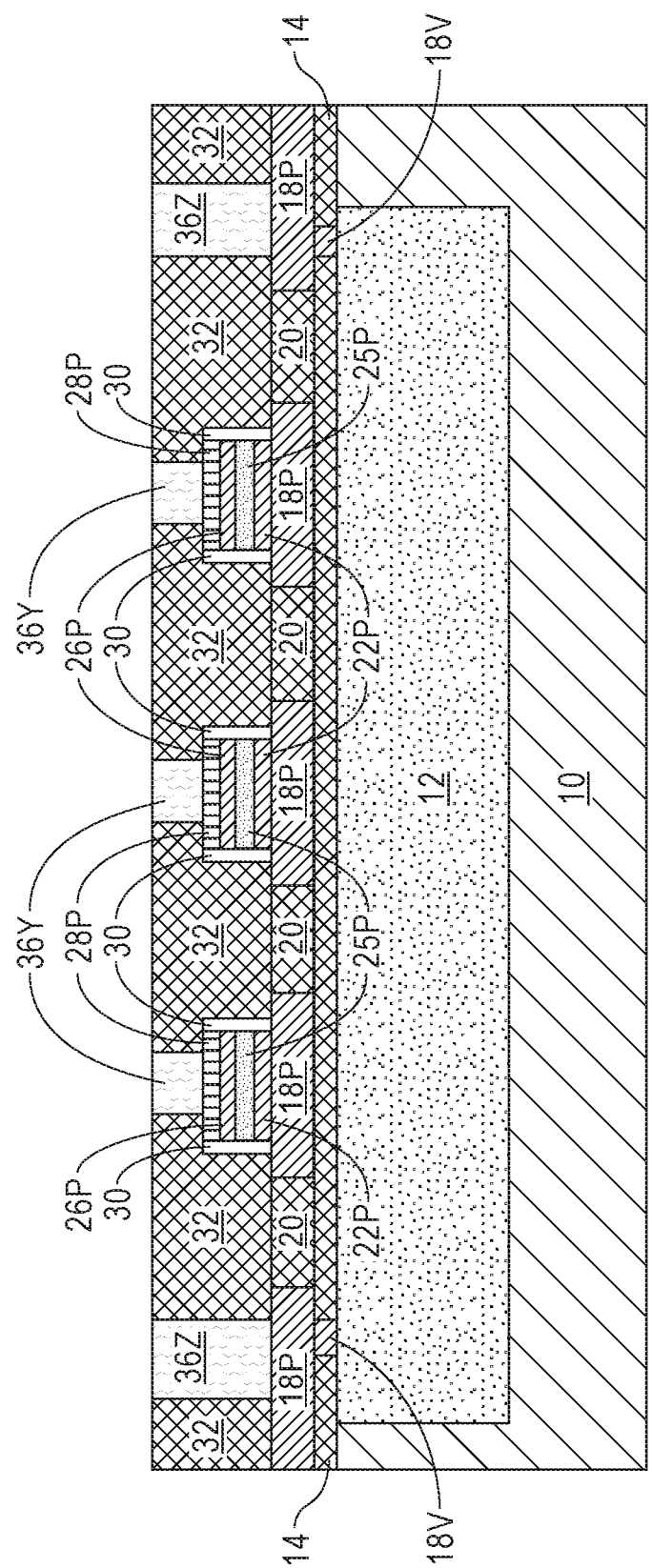
FIG. 13 is a cross sectional view of the exemplary structure of FIG. 12 after forming a metal-containing contact structure in each of the contact openings.

Referring now to FIG. 13, there is illustrated the exemplary structure of FIG. 12 after forming a metal-containing contact structure (36Y, 36Z) in each of the contact openings (34Y, 34Z). Each metal-containing contact structure (36Y, 36Z) can be composed of a contact metal or contact metal alloy. Examples of contact metals include, but are not limited to, tungsten (W), aluminum (Al), or copper (Cu). An example of a contact metal alloy is Cu—Al alloy. In some embodiments, a superconductor as described above can be used in providing each metal-containing contact structure (36Y, 36Z). Superconductors may be a preferred material for the contact structures (36Y, 36Z) since they would reduce energy consumption and heating of the chip. As is shown, each metal-containing contact structure (36Y, 36Z) has a topmost surface that is coplanar with a topmost surface of the second dielectric material layer 32.

Each metal-containing contact structure (36Y, 36Z) can be formed by filling the contact openings with conductive material that provides the metal-containing contact structures (36Y, 36Z). In some embodiments, a planarization process can follow the filling of the contact openings with the conductive material that provides the metal-containing contact structures (36Y, 36Z).

In the present application, each metal-containing contact structure 36Z contacts a surface of one of the metal-containing wiring structures 18P that contain the lower via portion 18V, each metal-containing contact structure 36Y contacts a topmost surface of one of the metal-containing caps 28P, or the topmost surface of one of the second superconductor material portions 26P). Metal-containing contact structure 36Z can be referred to as a wiring contact structure, while each metal-containing contact structure 36Y can be referred to as a JJ contact structure.

Reference will be first made to FIGS. 14-21 which illustrate a second method of the present application that can be used in providing a computing device containing a within-chip magnetic control device that is located in proximity to a JJ structure. In this embodiment of the present application, a conductive plate is embedded in semiconductor substrate, and at least one JJ structure is formed on a surface of the conductive plate. Wiring structures are then formed laterally adjacent to the at least one JJ structure and contact a surface of the semiconductor substrate. Next, contact structures are formed. Some of the contact structures contact the wiring structures that directly contact the semiconductor substrate, while other contact structures contact the JJ structures. In this embodiment, the wiring structures, not the conductive plate, serve as a magnetic control device that is located in proximity to the JJ structure. In this embodiment, the conductive plate is a wiring structure for the JJ structure.

In this embodiment, the magnetic field is generated by the wiring structures, not the conductive plate, by running current through the wiring structures. The strength of the magnetic field can be modulated by the amount of current passing through the wiring structures. Also, the magnetic field can be turned off as needed by ceasing to allow current to pass through the wiring structures.

Figure 14:
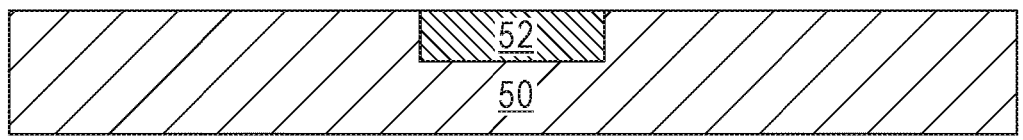
FIG. 14 is a cross sectional view of another exemplary structure that can be employed in accordance with an embodiment of the present application, the another exemplary structure includes a conductive plate embedded in a semiconductor substrate.

Referring first to FIG. 14, there is illustrated another exemplary structure that can be employed in accordance with an embodiment of the present application. This exemplary structure of FIG. 14 includes a conductive plate 52 embedded in a semiconductor substrate 50. The semiconductor substrate 50 and the conductive plate 52 for this embodiment of the present application are the same as the semiconductor substrate 10, and conductive plate 12, respectively for the embodiment shown in FIG. 1 above. As stated above, the conductive plate 52 of this embodiment is not used to generate a magnetic field, but instead is used as a wiring structure for the JJ structure.

Figure 15:
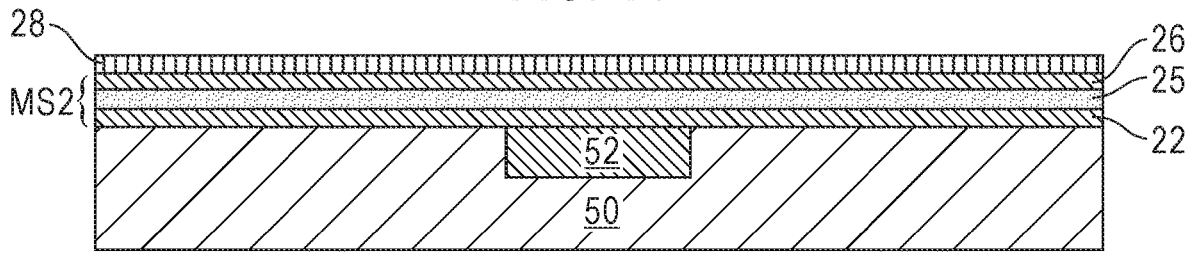
FIG. 15 is a cross sectional view of the exemplary structure of FIG. 14 after forming a JJ material stack on the semiconductor substrate and the conductive plate.

Referring now to FIG. 15, there is illustrated the exemplary structure of FIG. 14 after forming a JJ material stack, MS2, on the semiconductor substrate 50 and the conductive plate 52. The JJ material stack, MS2, of this embodiment includes a first superconductor material layer 22, as defined above, a Mn nanoparticle-containing crystalline silicon layer 25, as defined above, and a second superconductor material layer 26, as defined above. It is noted that other M nanoparticle containing crystalline semiconductor materials, as defined above, can be used instead of Mn nanoparticle-containing crystalline silicon. The JJ material stack, MS2, of this embodiment can be formed utilizing the processing steps mentioned above in forming the JJ material stack (See, for example, the description above regarding FIGS. 7-8). In some embodiments, a metal-containing capping layer 28, as defined above, is present on the JJ material stack, MS2. In other embodiments, the metal-containing capping layer 28 is not present on the JJ material stack, MS2.

Figure 16:
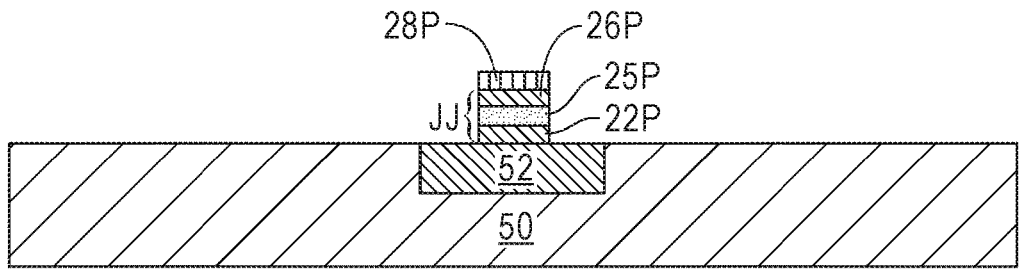
FIG. 16 is a cross sectional view of the exemplary structure of FIG. 15 after patterning the JJ material stack to provide a JJ structure on the conductive plate.

Referring now to FIG. 16, there is illustrated the exemplary structure of FIG. 15 after patterning the JJ material stack, MS2, to provide a JJ structure on the conductive plate 52. The patterning of the JJ material stack, MS2, of this embodiment is the same as the patterning of the JJ material stack, MS2, in the previous embodiment of the present application (see, FIG. 9 and the discussion above concerning FIG. 9). Each JJ structure includes a remaining (i.e., non-etched) portion of the first superconductor material layer 22 (hereinafter referred to as a firsts superconductor material portion 22P), a remaining (i.e., non-etched) portion of the Mn nanoparticle-containing crystalline silicon layer 25 (hereinafter referred to as a Mn nanoparticle-containing crystalline silicon portion 25P) and a remaining (non-etched) portion of the second superconductor material layer 26 (hereinafter referred to as a second superconductor material portion 26P). When the metal-containing capping layer 28 is present, a remaining (non-etched) portion of the metal-containing capping layer 28 (hereinafter referred to as a metal-containing cap 28P) is present atop each JJ structure.

Each JJ structure and, if present, metal-containing cap 28P can be cylindrical in shape (although other shapes are possible) and has a CD that is typically, but not necessarily always, less than the underlying CD of the surface of a conductive plate 52. As is shown, the various elements (22P, 25P, 26P) of the JJ structure have an outermost sidewall that is vertically aligned with each other. If present, the metal-containing cap 28P has an outermost sidewall that is vertically aligned with the outermost sidewall of the underlying JJ structure.

Figure 17:
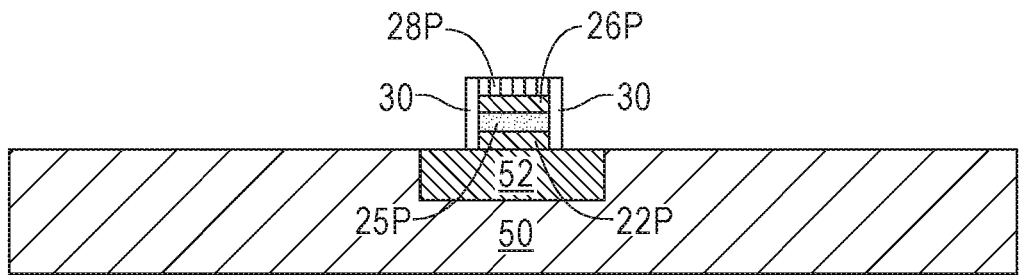
FIG. 17 is a cross sectional view of the exemplary structure of FIG. 16 after forming a dielectric spacer encapsulating the JJ structure.

Referring now to FIG. 17, there is illustrated the exemplary structure of FIG. 16 after forming a dielectric spacer 30 encapsulating the JJ structure. The dielectric spacer 30 of this embodiment is the same as the dielectric spacer 30 mentioned above. See, for example, the discussion concerning FIG. 10 above.

Figure 18:
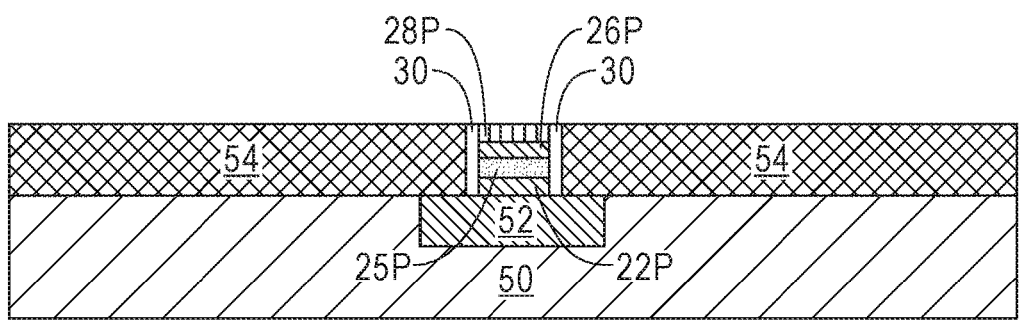
FIG. 18 is a cross sectional view of the exemplary structure of FIG. 17 after forming a first dielectric material layer laterally adjacent to the dielectric spacer encapsulated JJ structure.

Referring now to FIG. 18, there is illustrated the exemplary structure of FIG. 17 after forming a first dielectric material layer 54 laterally adjacent to the dielectric spacer encapsulated JJ structure. The first dielectric material layer 54 of this embodiment of the present application can be composed of one of the dielectric materials mentioned above for the first dielectric material layer 14. Alternatively, first dielectric material layer 54 of this embodiment can also be composed of an interlayer dielectric material such as, for example, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0; all dielectric constants are measured under vacuum unless otherwise stated herein). In another embodiment, a self-planarizing material such as a spin-on glass (SOG) or a spin-on low-k dielectric material can be used as the dielectric material for the first dielectric material layer 54.

The first dielectric material layer 54 can be formed utilizing a deposition process such as, for example, CVD, PECVD, or spin-on coating. A planarization process such as, for example, CMP, or an etch back process can follow the deposition of the dielectric material that provides the first dielectric material layer 54. The first dielectric material layer 54 has a topmost surface that is coplanar with either a topmost surface of the first dielectric material layer 54, or when the first dielectric material layer 54, the topmost surface of the second superconductor material portion 26P.

Figure 19:
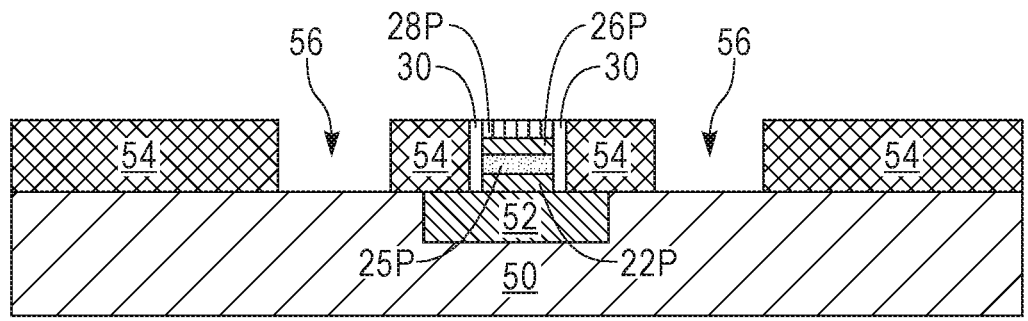
FIG. 19 is a cross sectional view of the exemplary structure of FIG. 18 after forming openings in the first dielectric material layer, wherein each opening physically exposes a surface of the semiconductor substrate.

Referring now to FIG. 19, there is illustrated the exemplary structure of FIG. 18 after forming openings 56 in the first dielectric material layer 54, wherein each opening 56 physically exposes a surface of the semiconductor substrate 50. The openings 56 can be formed by lithography and etching as defined above.

Figure 20:
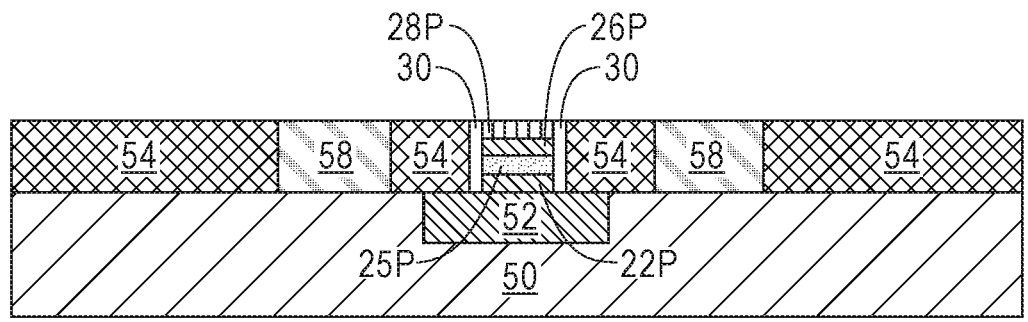
FIG. 20 is a cross sectional view of the exemplary structure of FIG. 19 after forming metal-containing wiring structures in each of the openings.

Referring now to FIG. 20, there is illustrated the exemplary structure of FIG. 19 after forming a metal-containing wiring structure 58 in each of the openings 56. Each metal-containing wiring structure 58 can include one of the electrically conductive metals, electrically conductor metal alloys or superconductor materials mentioned above for the conductive plate 12. Each metal-containing wiring structure 58 can be composed of a material that is compositionally the same as, or compositionally different from, the material that provides the conductive plate 52. A pair of metal-containing wiring structures 58 is shown by way of one example.

Each metal-containing wiring structure 58 can be formed by depositing one of an electrically conductive metal, an electrically conductor metal alloy or a superconductor material utilizing one of the deposition processes mentioned above for forming conductive plate 12. A planarization process such, as for example, CMP, can follow the deposition of the material that provides the metal-containing wiring structure 58. Each metal-containing wiring structure 58 has a topmost surface that is typically, but not necessarily always, coplanar with a topmost surface of the first dielectric material layer 54. As is shown, the metal-containing wiring structures 58 are laterally adjacent to the area containing the JJ structure.

Figure 21:
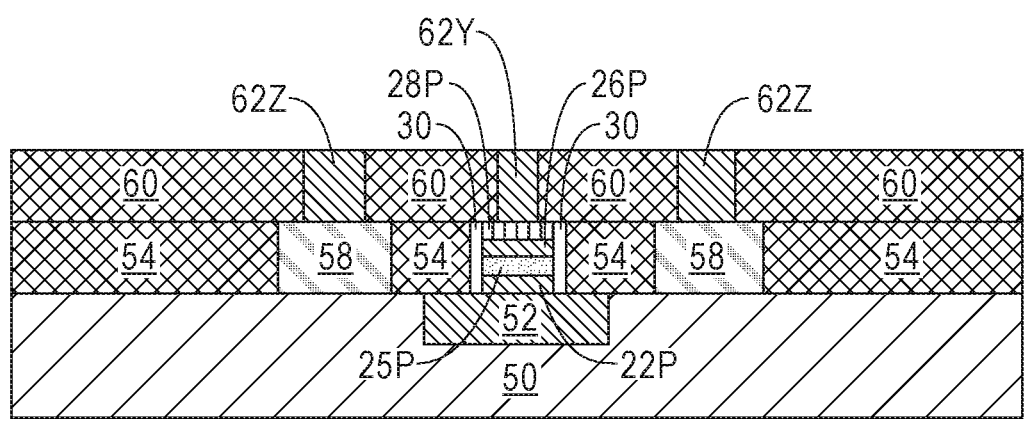
FIG. 21 is a cross sectional view of the exemplary structure of FIG. 20 after forming a second dielectric material layer on the first dielectric material layer, wherein the second dielectric material layer includes a plurality of contact structures embedded therein.

Referring now to FIG. 21, there is illustrated the exemplary structure of FIG. 20 after forming a second dielectric material layer 60 on the first dielectric material layer 54, wherein the second dielectric material layer 60 includes a plurality of contact structures (62Y, 62Z) embedded therein.

The second dielectric material layer 60 of this embodiment of the present may include one of the dielectric materials mentioned above for the first dielectric material layer 54. The second dielectric material layer 60 can be composed of a dielectric material that is compositionally the same as, or compositionally different from, the dielectric material that provides the first dielectric material layer 54. The second dielectric material layer 60 can be formed utilizing one of the deposition processes mentioned above for forming the first dielectric material layer 54.

The plurality of contact structures (62Y, 62Z) that are embedded in the second dielectric material layer 60 can be formed by first providing contact openings into the second dielectric material layer 60, wherein some of the contact openings physically expose the metal-containing wiring structures 58, and other contact openings physically expose either a topmost surface of the metal-containing cap 28P or, if the metal-containing cap 38P is not present, a topmost surface of the second superconductor material portion 28P of the JJ structure. The contact openings can be formed by lithography and etching.

Each metal-containing contact structure (62Y, 62Z) can be composed of a contact metal or contact metal alloy. Examples of contact metals include, but are not limited to, tungsten (W), aluminum (Al), or copper (Cu). An example of a contact metal alloy is Cu—Al alloy. In some embodiments, a superconductor as defined above can be used in providing each metal-containing contact structure. Superconductors may be a preferred material for the contact structures (62Y, 62Z) since they would reduce energy consumption and heating of the chip. As is shown, each metal-containing contact structure (62Y, 62Z) has a topmost surface that is coplanar with a topmost surface of the second dielectric material layer 60.

Each metal-containing contact structure (62Y, 62Z) can be formed by filling the contact openings with conductive material that provides the metal-containing contact structures (62Y, 62Z). In some embodiments, a planarization process can follow the filling of the contact openings with the conductive material that provides the metal-containing contact structures (62Y, 62Z).

In the present application, each metal-containing contact structure 62Z contacts a surface of one of the metal-containing structures 58, each metal-containing contact structure 62Y contacts a topmost surface of one of the metal-containing caps 28P, or the topmost surface of one of the second superconductor material portions 26P. Metal-containing contact structure 62Z can be referred to as a wiring contact structure, while each metal-containing contact structure 62Y can be referred to as a JJ contact structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A computing device comprising:
  a conductive plate located in a trench that is present in a semiconductor substrate, wherein at least a sidewall of the conductive plate forms an interface with a laterally adjacent semiconductor material of the semiconductor substrate;
  at least one Josephson Junction (JJ) structure located above the conductive plate; and
  first wiring structures located laterally adjacent to the at least one JJ structure, wherein one of the conductive plate or the first wiring structures is configured to induce a magnetic field to the at least one JJ structure upon applying an electrical current thereto.
2. The computing device of claim 1, wherein the first wiring structures directly contact a surface of the conductive plate, the at least one JJ structure is spaced apart from the conductive plate, and the conductive plate induces the magnetic field to the at least one JJ structure.

3. The computing device of claim 2, wherein the at least one JJ structure is located on a surface of a second wiring structure which is laterally spaced apart from the first wiring structures, and is vertically spaced apart from the conductive plate.

4. The computing device of claim 3, wherein the at least one JJ structure has a width that is less than a width of the second wiring structure.

5. The computing device of claim 3, further comprising a wiring contact structure contacting each first wiring structure and a JJ contact structure contacting the at least one JJ structure.

6. The computing device of claim 1, wherein the conductive plate is composed of an electrically conductive metal, an electrically conductive metal alloy or a superconductor material.

7. The computing device of claim 1, wherein the first wiring structures are composed of an electrically conductive metal, an electrically conductive metal alloy or a superconductor material.

8. The computing device of claim 1, further comprising a dielectric spacer encapsulating the at least one JJ structure.

9. The computing device of claim 1, wherein the at least one JJ structure comprises a first superconductor material portion, a Mn nanoparticle-containing crystalline silicon portion, and a second superconductor material portion.

10. The computing device of claim 9, further comprising a metal-containing cap located on the second superconductor material portion of the at least one JJ structure.

* * * * *